United States Patent
Chakrapani et al.

(10) Patent No.: US 7,394,716 B1
(45) Date of Patent: Jul. 1, 2008

(54) BANK AVAILABILITY INDICATIONS FOR MEMORY DEVICE AND METHOD THEREFOR

(75) Inventors: Anuj Chakrapani, Bangalore (IN); Rajesh Manapat, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 2 days.

(21) Appl. No.: 11/395,416

(22) Filed: Mar. 31, 2006

Related U.S. Application Data

(60) Provisional application No. 60/667,412, filed on Apr. 1, 2005.

(51) Int. Cl.
*G11C 8/00* (2006.01)

(52) U.S. Cl. .............. 365/230.03; 365/230.01; 365/233.1; 365/230.02

(58) Field of Classification Search ............ 365/230.03, 365/233.1, 230.01
See application file for complete search history.

(56) References Cited

U.S. PATENT DOCUMENTS

| | | | |
|---|---|---|---|
| 5,323,489 A | 6/1994 | Bird | |
| 5,530,836 A | 6/1996 | Busch et al. | |
| 5,936,903 A | 8/1999 | Jeng et al. | |
| 5,995,438 A | 11/1999 | Jeng et al. | |
| 6,137,807 A | 10/2000 | Rusu et al. | |
| 6,360,285 B1 | 3/2002 | Fenwick et al. | |
| 6,580,659 B1* | 6/2003 | Roohparvar | 365/233 |
| 6,691,204 B1* | 2/2004 | Roohparvar | 365/189.07 |
| 7,051,178 B2* | 5/2006 | Roohparvar | 365/189.07 |
| 2004/0049629 A1* | 3/2004 | Miura et al. | 711/105 |
| 2004/0153613 A1* | 8/2004 | Rooparvar | 711/154 |

OTHER PUBLICATIONS

Micron Technology, Inc., "Synchronous DRAM", Data Sheet, Copyright 2002.

* cited by examiner

*Primary Examiner*—Thong Q Le
(74) *Attorney, Agent, or Firm*—Haverstock & Owens, LLP

(57) ABSTRACT

In one arrangement, a memory device (100) can include a number of banks (102-0 to 102-2") and corresponding counters (104-0 to 104-2"). In response to a corresponding active access signal, each counter (104-0 to 104-2") can generate a bank available indication (BA0 to BA-2") that may be initially inactive, and remain inactive during an initial count operation. Once a counter (104-0 to 104-2") reaches a predetermined limit, the corresponding bank available indication (BA0 to BA-2") can be activated. A count limit can correspond to a minimum active-to-active timing parameter ($T_{RC}$). An output circuit 106 can provide output data BA_DATA representative of bank available indications (BA0 to BA-2").

20 Claims, 6 Drawing Sheets

US 7,394,716 B1

BANK AVAILABILITY INDICATIONS FOR MEMORY DEVICE AND METHOD THEREFOR

This application claims the benefit of U.S. provisional patent application Ser. No. 60/667,412, filed Apr. 1, 2005.

TECHNICAL FIELD

The present invention relates generally to electronic circuits, and more particularly to memory devices having minimum time periods between accessing different rows of a same bank.

BACKGROUND OF THE INVENTION

Memory devices, such as dynamic random access memories (DRAMs), enjoy wide use in electronic devices. DRAMs can be considered "dynamic" in that memory values can be lost unless continually (i.e., dynamically) refreshed. Conventional DRAMs can have a very high capacity to store data, as compared to other memory device types, and are relatively less costly when compared to other memory device types. Conventional DRAMs can typically include a number of banks each of which includes multiple rows of memory cells. A bank selection operation can be used to select which bank can be active at a given time.

In a conventional DRAM, a row can be accessed by first "activating" a row within a given bank. Such an activation typically includes the application of a certain combination of control signals along with a row address. Even more particularly, in a synchronous DRAM, a row can be activated by different combinations of a chip select (CS) signal, row address strobe (RAS) signal, column address strobe (CAS) signal, and write enable (WE) signal. Different combinations can indicate different command types, including, but not limited to, ACTIVE, READ, WRITE, and PRECHARGE commands. Accesses typically start by activating a row with an ACTIVE command.

Following a row access, a precharge command can be issued to precharge bit lines and thus condition the bank for a subsequent access. Such a feature can give rise to an active-to-active timing parameter ($T_{RC}$). A parameter $T_{RC}$ can refer to a minimum allowable time between two row activation cycles on a same bank.

To better understand various features of the disclosed embodiments, a conventional memory device will now be described.

A block diagram of a conventional DRAM with a multi-bank architecture is shown in FIG. 7, and designated by the general reference character 700. A DRAM 700 can include a core 702 (where data is stored) arranged in the form of a number of memory array banks, typically either effectively 4 or 8 in number.

Accesses to a DRAM can involve opening a row in a particular bank (row activation) and then selecting a particular column, along with the assertion of the appropriate control signals. Following row activation, the same row can then be "closed" (or precharged), before a different row of the same bank can be accessed. The above sequence can take several cycles (e.g., minimum of 8) and hence can limit the frequency at which a bank can be accessed. In other words, a first activation of a row can make the bank 'unavailable' (for a subsequent access to a different row) for a specific period of time. This time period of $T_{RC}$ can be a critical specification in a DRAM device. In particular, if a second successive access to the same bank happens such that it violates the $T_{RC}$ limit, the access can be unsuccessful.

Referring now to FIG. 8, a timing diagram shows one example of a conventional $T_{RC}$ timing arrangement. FIG. 8 shows a read operation for an address multiplexed synchronous DRAM. FIG. 8 shows a clock signal CLK, an applied address "Address", an applied command "Command", a data output "Data". At time t0, a row in a particular bank can be activated by application of an activate command ACT along with a row address ROW. At time t1, a read command RD can be issued along with a column address COL. At time t2, a burst of read data can start to be output beginning with data value DQ1.

At time t3, a predetermined time before a last data value DQ4 is output, a precharge command PRE can be issued. At this time, bit lines have already output data value DQ4 (or currently outputting such data). Thus, a precharge operation can be initiated. However, while such a precharge operation is taking place, the same bank may not be accessed. As a result, there is a "bank lockout period" 800 between times t3 and t4, during which a new active command may not be received, or be considered invalid.

At time t4, precharge operations are completed, and a new active command can be issued.

Thus, in FIG. 8, a parameter $T_{RC}$ extends from time t0 to t4.

Conventional SDRAMS with a banked architecture can enable the pipelining of accesses to the memory. In particular, multiple banks can be active at the same time, thereby allowing for faster access. However, as explained above, in accessing a row, the bank must be conditioned with an activate command and subsequently closed with a precharge command.

A drawback to conventional arrangements can be that an SDRAM controller, different from the SDRAM devices, typically must track bank availability. An SDRAM controller is typically a different integrated circuit device that issues commands and addresses to one or more SDRAMs. As a result, SDRAM controllers can be increasingly more complex, having to track multiple operations and states of corresponding SDRAMs, including bank availability. Failure to keep track of bank availability can result in access failures. While conventional solutions have an SDRAM controller tracking bank availability, this can limit an SDRAM controller as other operations that can be started during a bank lockout period may be overlooked.

DETAILED DESCRIPTION

The various disclosed embodiments are directed to memory devices that can track bank availability. Such information can be communicated to a controller or other different device. A controller can then be free to access specific addresses in the memory device based on such bank availability. This can allow for more efficient access to such memory devices.

Figure 1:
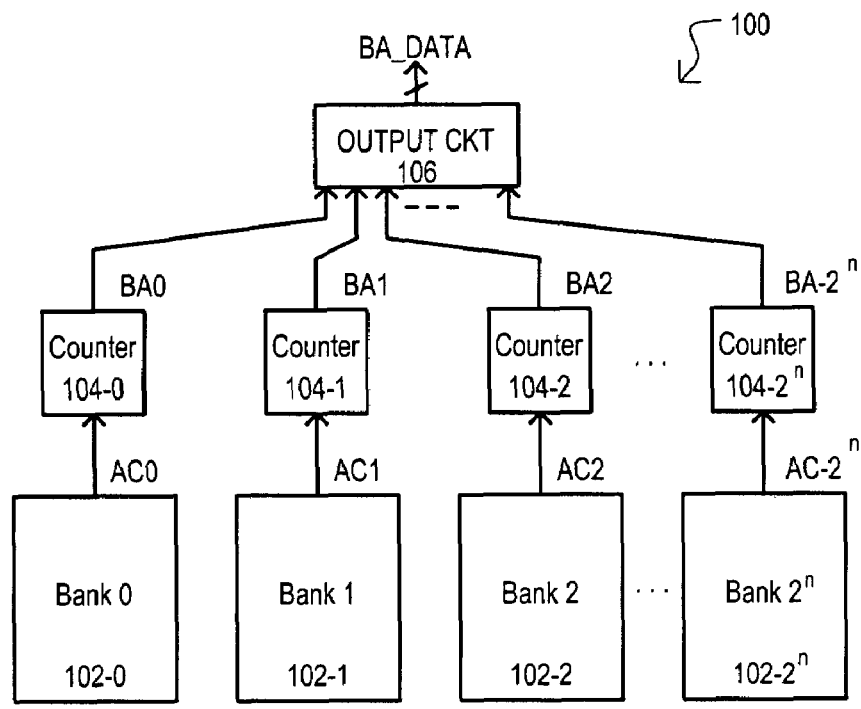
FIG. 1 is a block schematic diagram of a first embodiment.

Referring now to FIG. 1, a memory device according to first embodiment is shown in a block diagram and designated by the general reference character 100. A memory device 100 can include a number of banks 102-0 to 102-2″, corresponding counters 104-0 to 104-2″, respectively, and a signal output circuit 106. a multiple rows. As but one example, each bank (102-0 to 102-2″) can include one or more arrays of memory cells having memory cells of a same row connected to a common word line (or collection of global and local word lines) and memory cells of a same column being connected to one or more common bit lines (or a collection of global and local bit lines). Preferably, memory cells can be dynamic random access memories (DRAMs).

Referring still to FIG. 1, each bank (102-0 to 102-2″) can provide an access signal (AC0 to AC-2″). An access signal (AC0 to AC-2″) can be activated when a row in the corresponding bank (102-0 to 102-2″) is accessed. For example, an access signal (ACO to AC-2″) can be activated in response to an ACTIVE command being targeted to the corresponding bank (102-0 to 102-2″).

Each counter (104-0 to 104-2″) can receive an access signal (AC0 to AC-2″) from its corresponding bank (102-0 to 102-2″). In response to an active access signal, a corresponding counter can start a counting operation. In one embodiment, a counting operation can be based upon a periodic timing signal. Preferably, a memory device 100 can be a synchronous DRAM, and counting operations can be based on a clock signal. In response to a generated count, each counter (104-0 to 104-2″) can output a bank available indication (BA0 to BA-2″). More particularly, a bank available indication (BA0 to BA-2″) may be initially inactive, and remain inactive during an initial count operation. Once a counter (104-0 to 104-2$_n$) reaches a predetermined limit, it can activate its corresponding bank available indication (BA0 to BA-2″). A count limit can correspond to a minimum active-to-active timing parameter ($T_{RC}$).

An output circuit 106 can provide output data BA_DATA representative of bank available indications (BA0 to BA-2″).

In this way, a memory device can generate indications that identify when a bank is available for access following an initial access. Accordingly, such data need not be tracked by another device, such as a memory controller.

Bank available indications (BA0 to BA-2″) can be output to other devices (e.g., memory controller) in various ways. Two of the many possible examples of output circuits are shown in FIGS. 2A and 2B.

Figures 2A, 2B:
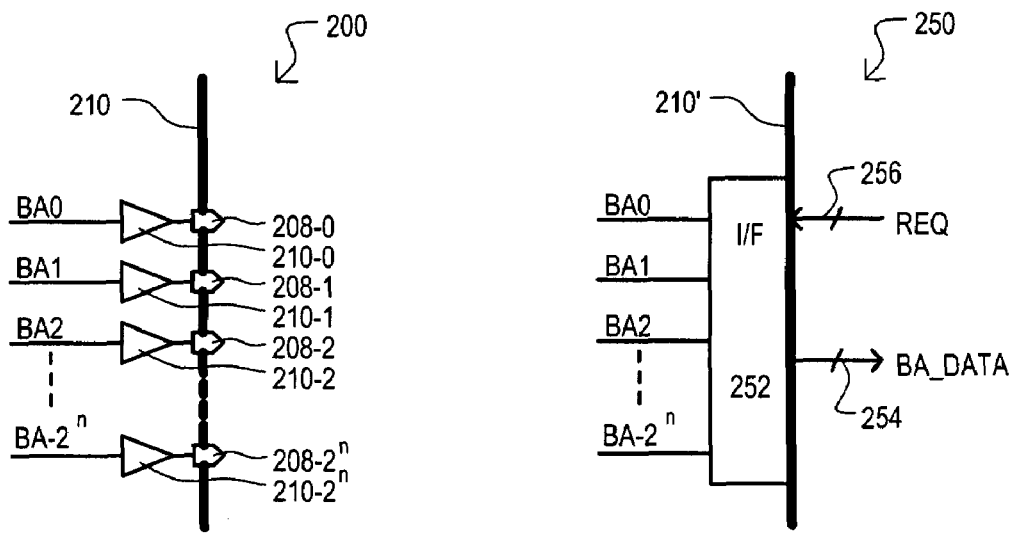
FIG. 2A is a block schematic diagram of one example of an output circuit that can be used in the embodiments.
FIG. 2B is a block schematic diagram of a second example of an output circuit that can be used in the embodiments.

Referring to FIG. 2A, a first example of an output circuit is shown in a block schematic diagram and designated by the general reference character 200. Output circuit 200 can represent one version of output circuit 106 of FIG. 1. An output circuit 200 can receive bank available indications (BA0 to BA-2″), and amplify such values to drive signals on corresponding signal terminals (208-0 to 208-2″). In the particular example shown, signal terminals (208-0 to 208-2″) can be output pins of an integrated circuit device. Thus, line 210 can represent a physical boundary of a memory device.

In this way, an output circuit can pass through bank available indications as output signals.

Referring to FIG. 2B, a second example of an output circuit is shown in a block schematic diagram and designated by the general reference character 250. Output circuit 250 can represent another version of output circuit 106 of FIG. 1. An output circuit 250 can include an interface circuit 252, data bus 254, and request bus 256. An interface circuit 252 can receive bank available indications (BA0 to BA-2″), and provide such values as output data BA_DATA according to request signals REQ.

In this way, bank available indications can be output according to some predetermined data and/or timing convention.

Figure 3:
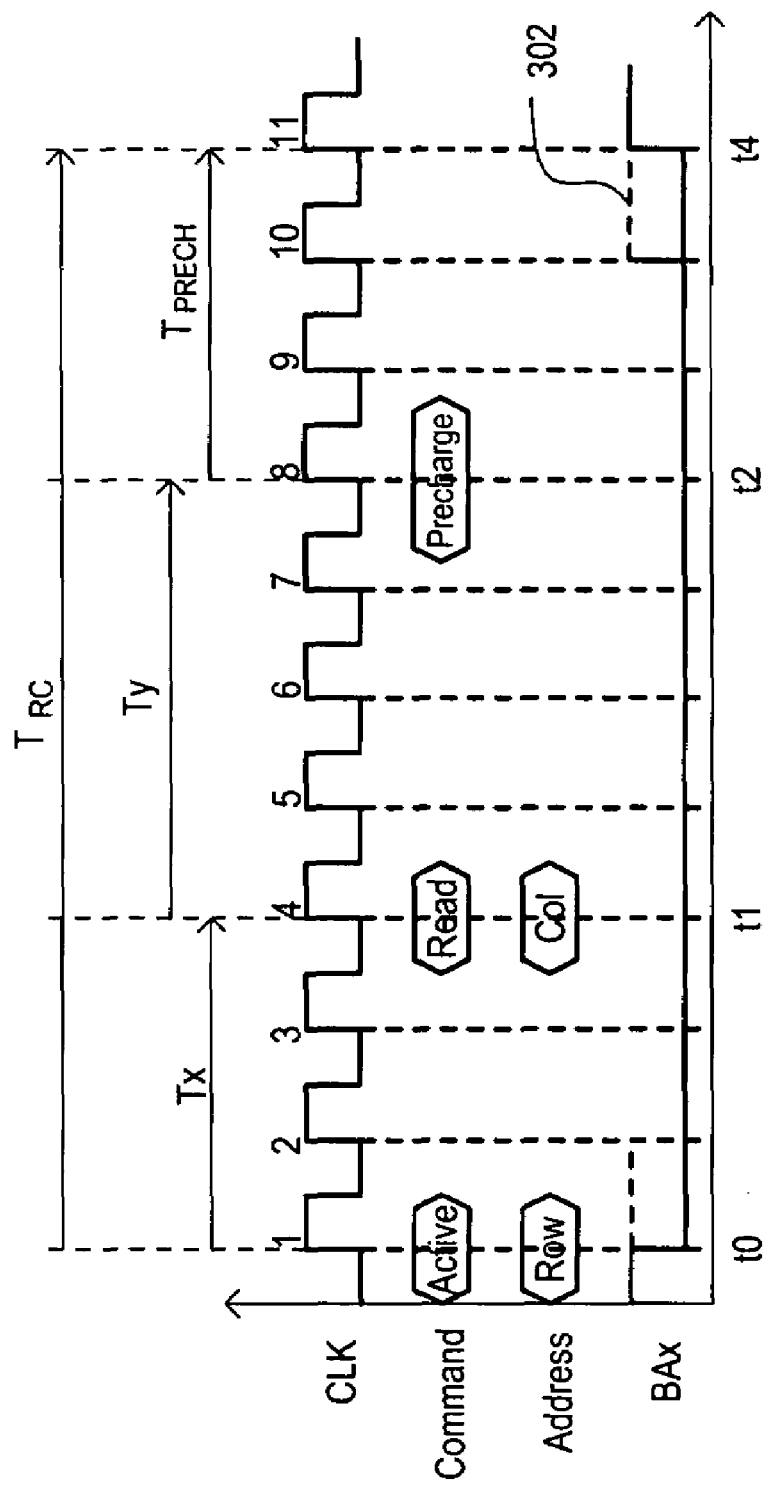
FIG. 3 is a timing diagram showing the generation of a bank available indication according to a second embodiment.

Referring now to FIG. 3, one example showing the generation of a bank available indication for one bank is set forth in a timing diagram. The timing diagram shows a clock waveform CLK, a command waveform "Command", an address waveform "Address", and a bank available indication waveform BAx. A clock waveform CLK can show a periodic clock signal from which internal memory device timing can be based. Preferably a clock signal can be an externally received clock signal, that can be conditioned (e.g., via phased lock loop) to generate internal timing signals. However, in other embodiments, such a clock may be internally generated. A "Command" waveform can show a command issued to a memory device. An "Address" waveform can show an address applied to the memory device. A bank available indication BAx can be generated by a counter according to any of the embodiments set forth herein.

Prior to time t0, it is assumed that the bank has been precharged. Accordingly, bank available indication BAx can be high, indicating that the bank is available for an access operation.

At time t0, an active command "Active" can be received by a memory device along with a row address "Row". A row address can indicate which bank is to be accessed. In response, a memory device can deactivate the corresponding bank available indication BAx.

At time t1, an access command and corresponding column address can be received by a memory device. In the particular example shown, the access command can be a read command "Read". The time between the issuance of an active command to an operation command (i.e., read or write) is shown as Tx, and can be considered an active-to-command timing parameter.

In the particular example of FIG. 3, data can be output in response to a read operation between time t1 and t2. More particularly, following time t2, use of bit lines will no longer be needed (data may be progressing along an output data pipeline). It is understood that in a write operation, data may be applied concurrently with a write command, and on a number of subsequent cycles. After a last data value has been received, there may be some latency before bit lines are no longer needed. A time between an initial access time, and the time when bit lines are no longer needed is shown in FIG. 3 as Ty, and can be considered a command-to-data end timing parameter.

At time t2, a precharge command "Precharge" can be received by the memory device, starting a precharge sequence.

At time t4, a precharge sequence can be complete, or close enough to completion, to allow a new access cycle to begin by applying a second active command. A counter can activate a bank available indication BAx at this time, thereby indicating the bank can be accessed once again. FIG. 3 shows an alternate activation time 302 for bank activation signal that can introduce a lead time into a bank activation signal, to signal bank availability some predetermined number of cycles ahead of time. This can account for address propagation time, for example, in a subsequent access.

A time between reception of a precharge command and completion at time t4 can be considered a precharge timing parameter $T_{PRECH}$.

From FIG. 3, it is understood that a time between reception of an active command (e.g., time t0) and a next active command can be an active-to-active timing parameter ($T_{RC}$).

In this way, a bank available signal can be deactivated in response to an activation command, and then activated once the bank is available for a new activation command. In alternate arrangements, a bank deactivation can lag actual reception of an active command by a predetermined amount, and/or can lead actual availability of a bank by a predetermined amount.

Figure 4:
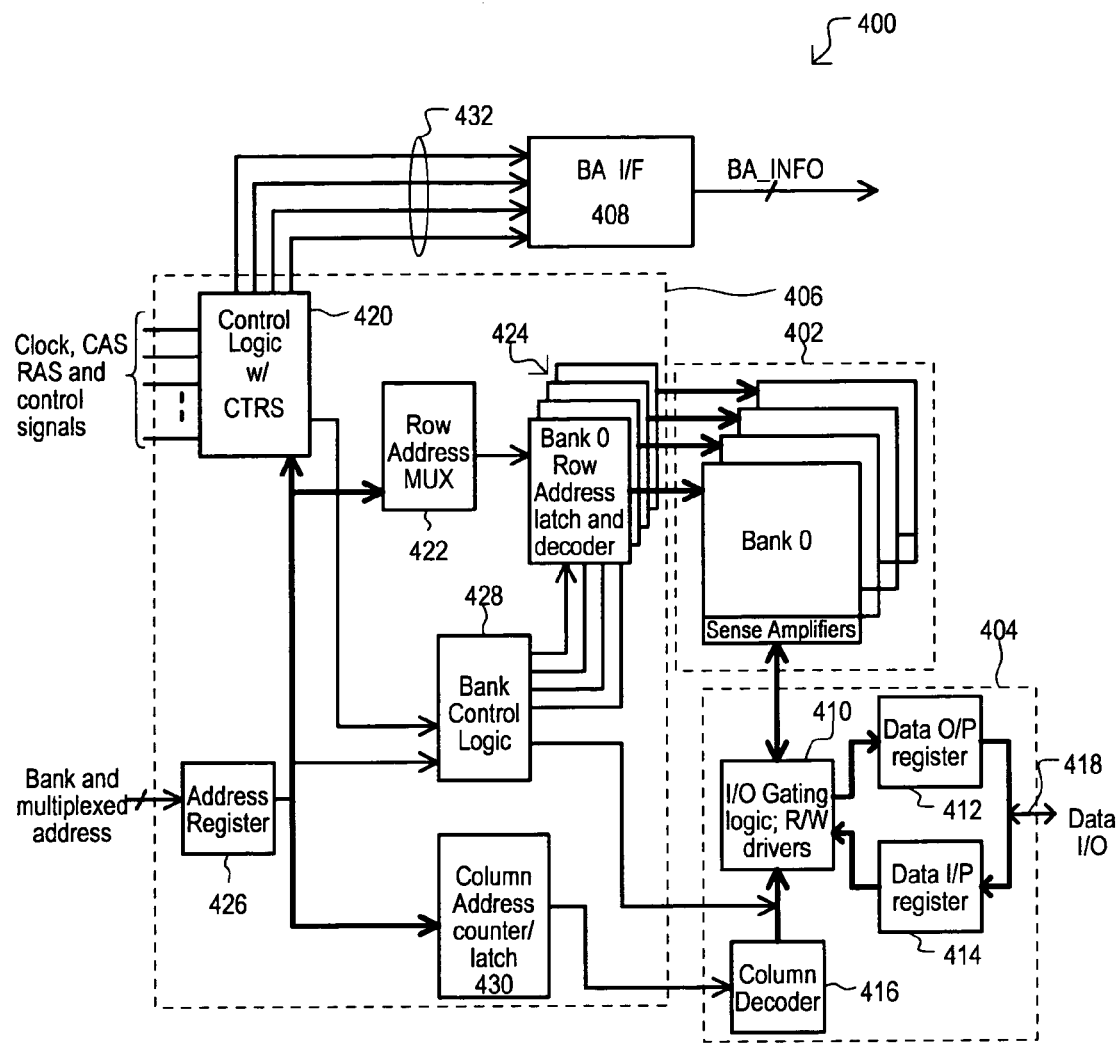
FIG. 4 is a block schematic diagram of a second embodiment.

Referring now to FIG. 4, block schematic diagram of a memory device according to a second embodiment is shown and designated by the general reference character 400. A memory device 400 can be a synchronous dynamic random access memory (SDRAM), and can include a bank section 402, an input/output (I/O) section 404, a control and access section 406, and a bank availability interface (I/F) 408. A bank section 402 can include a number of banks, each of which can include DRAM cells accessible according to bank select signals, row addresses and column addresses. Once a row in one bank has been accessed, bit lines of the bank can be precharged to in order to be conditioned for a subsequent access, thus introducing an active-to-active timing parameter.

An I/O section 404 can include I/O gating logic and read/write (R/W) drivers 410, data output registers 412, data input registers 414, and a column decoder 416. I/O gating logic and R/W drivers 410 can access columns within each bank of section 402, for read, write and/or refresh operations. Particular columns can be accessed for read or write operations based on select signals provided by a column decoder 416. In a read operation, read data driven by R/W drivers can be stored within data output latch 412, and subsequently output via data I/O 418. Conversely, in a write operation, write data received via data I/O 418 can be driven by R/W drivers and captured within data input register 414.

A control and access section 406 can include control logic 420, a row address multiplexer (MUX) 422, row and address latches and decoders 424, an address register 426, bank control logic 428, and a column address counter/latch 430.

Control logic 420 can receive input control signals that can establish timing for operations within memory device 400 as well as indicate particular commands for execution. Such input control signals can include, as but one example, a clock signal, a column address strobe (CAS), a row address strobe (RAS) signal, and other input control signals. In response to such input control signals, control logic 420 can output control signals to row address MUX 422, bank control logic 428, and column address counter/latch 430.

Unlike a conventional arrangement, control logic 420 can include bank availability counters corresponding to each bank within section 402. The embodiment of FIG. 4 illustrates one particular example in which bank availability counters need not be situated proximate to their corresponding banks. Thus, control logic 420 can output bank availability signals 432, at least one bank availability signal corresponding to each operational bank within memory device 400.

A row address MUX 422 can output row addresses to a row address latch and decoder (one of 424) corresponding to a selected bank. Row address latches and decoders 424 can latch and decode a row address, and thus enable a row within a corresponding bank to be accessed (e.g., one or more word lines activated).

Address register 426 can receive address values corresponding to accesses. In the example of FIG. 4, memory device 400 can operate according to multiplexed addresses. Thus, in a read or write operation, address latch 426 can first latch a row address, and provide row address data to control logic 420, row address MUX 422 and bank control logic 428. Subsequently, address latch 426 can latch a column address, and provide column address data to a column address counter/latch 430.

Bank control logic 428 can receive address values and control signals, and in response, control timing and operation of row address latches and decoders 424, as well as I/O gating logic and R/W drivers 410.

Column address counter/latch 430 can receive column address information and control signals. In response, column address counter/latch 430 can provide one or a sequence (burst) of column addresses to column decoder 416.

A bank availability I/F 408 can receive bank available signals 432, and provide bank availability information to a device external to SDRAM 400. A bank availability I/F 408 can provide bank availability information in various formats, and according to various protocols. A few of the many possible examples will be described in more detail below.

Figure 5A:
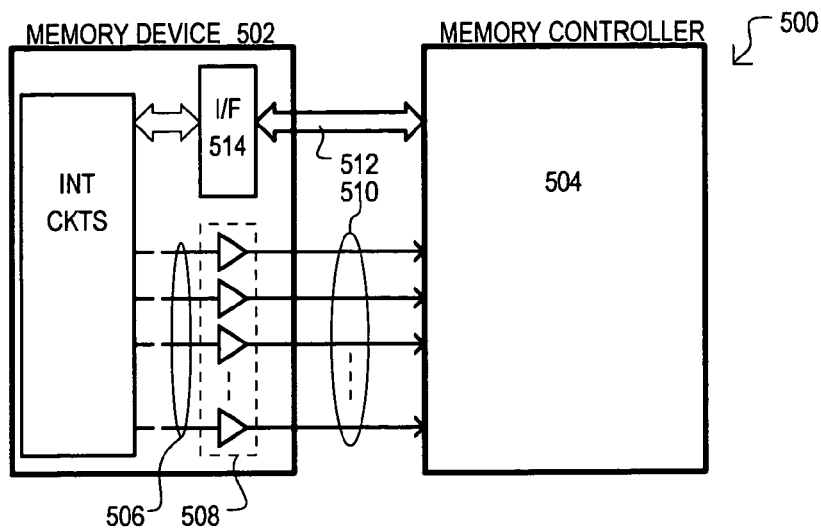
FIGS. 5A to 5D show examples of systems and interface arrangements according to various embodiments.

Referring now to FIGS. 5A to 5D, examples of memory systems and corresponding bank interfaces are shown in a number of block diagrams. FIG. 5A shows a system 500 that includes a memory device 502 and a controller 504. Within memory device 502, bank available indications 506 can be buffered by interface 508 and driven on dedicated bank available lines 510 connected to inputs of controller 504. Controller 504 can otherwise communicate with memory device 502 over a conventional control/data bus 512 via a conventional communication interface 514.

In this way, bank available indications can be provided in dedicated signal lines to a memory controller.

Figure 5B:
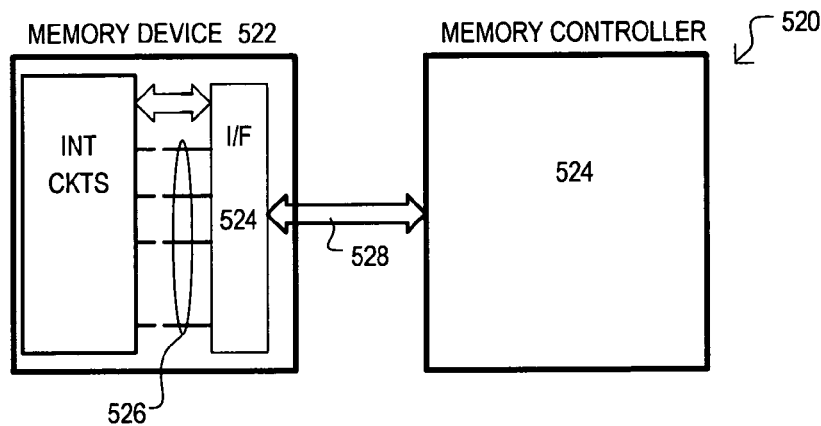

FIG. 5B shows a system 520 in which a memory device 522 can include a modified interface 524. Modified interface 524 can control the input and output of control and data signals between memory controller 524 and memory device 522. However, unlike a conventional interface, modified interface 524 can receive bank available indications 526, and output such indications to memory controller 524 based on control signals from memory controller 524. Thus, a control/data bus 528 can carry conventional data, as well as bank available data.

In this way, bank available indications can be provided to a memory controller on a communication bus used for transmitting other control and/or data values.

Figure 5C:
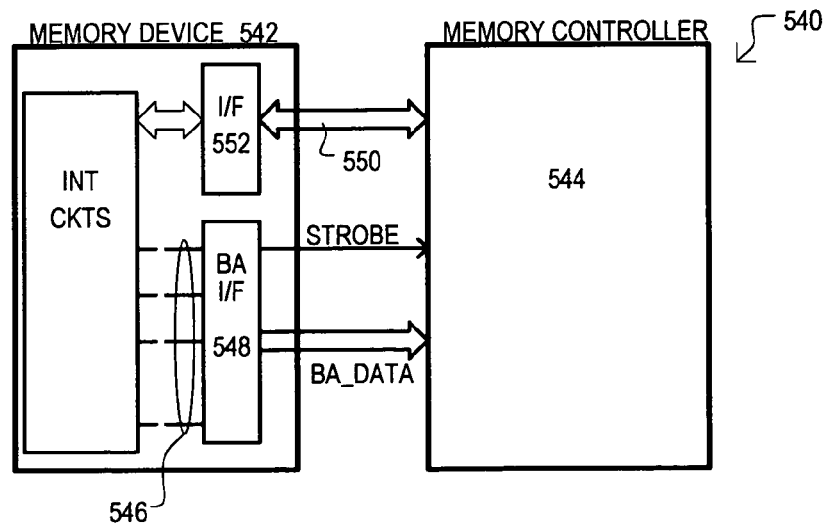

FIG. 5C shows a system 540 in which a memory device 542 can transmit bank available indication data to a memory controller 544 based on its own internal timing. In the particular example shown, bank available signals 546 can be received by interface 548. Bank available data can then be output along with a strobe signal STROBE to enable memory controller 544 to latch such data. Controller 544 can otherwise communicate with memory device 542 over a conventional control/data bus 550 via a conventional communication interface 552.

In this way, bank available indications can be output to a memory controller based on timing generated by a memory device.

Figure 5D:
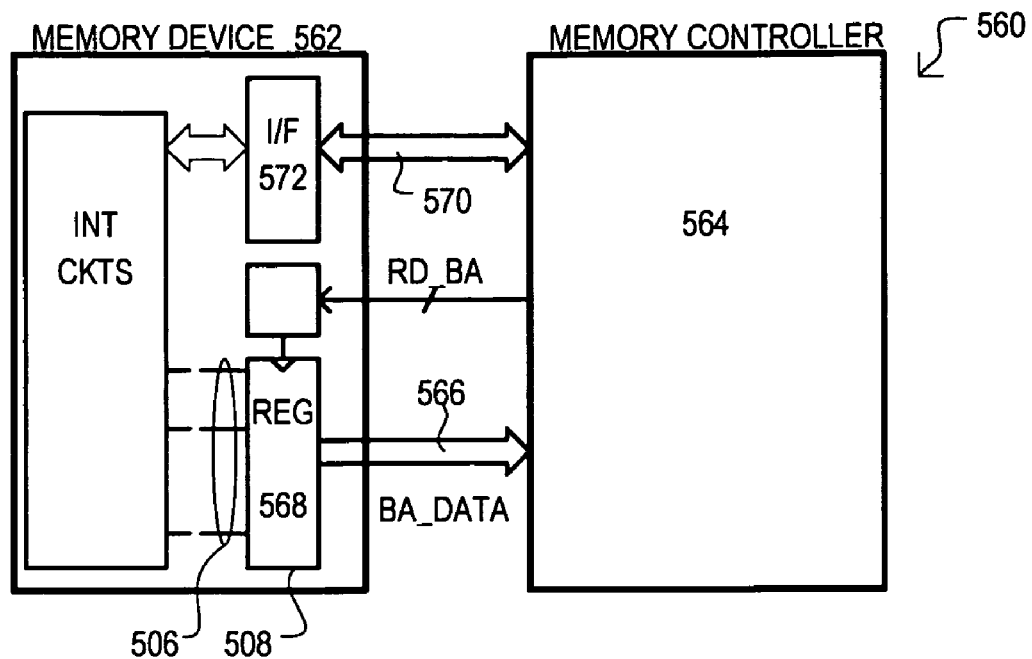

FIG. 5D shows a system 560 in which a memory controller 564 can read bank available indication data from a memory device 562. In the particular example shown, bank available data 566 can be received by interface 568, which can be an addressable register. Bank available data can be read by memory controller 564 with a read data RD_BA, which can include a read command and corresponding register address. Controller 564 can otherwise communicate with memory device 562 over a conventional control/data bus 570 via a conventional communication interface 572.

In this way, bank available indications can be read by a memory controller based on timing generated by the memory controller.

Figure 6:
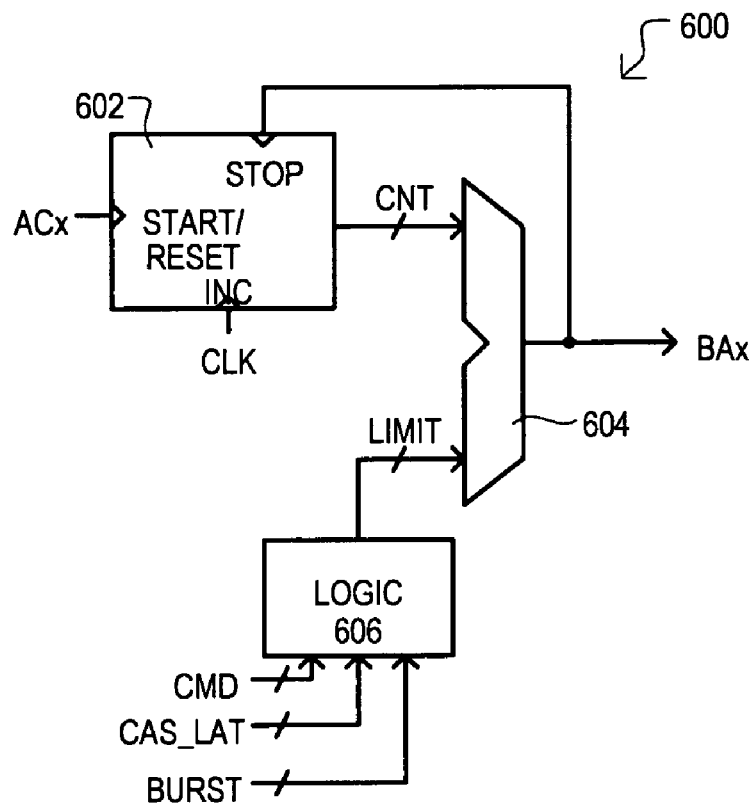
FIG. 6 is block schematic diagram of one example of a bank available counter.
Figure 7:
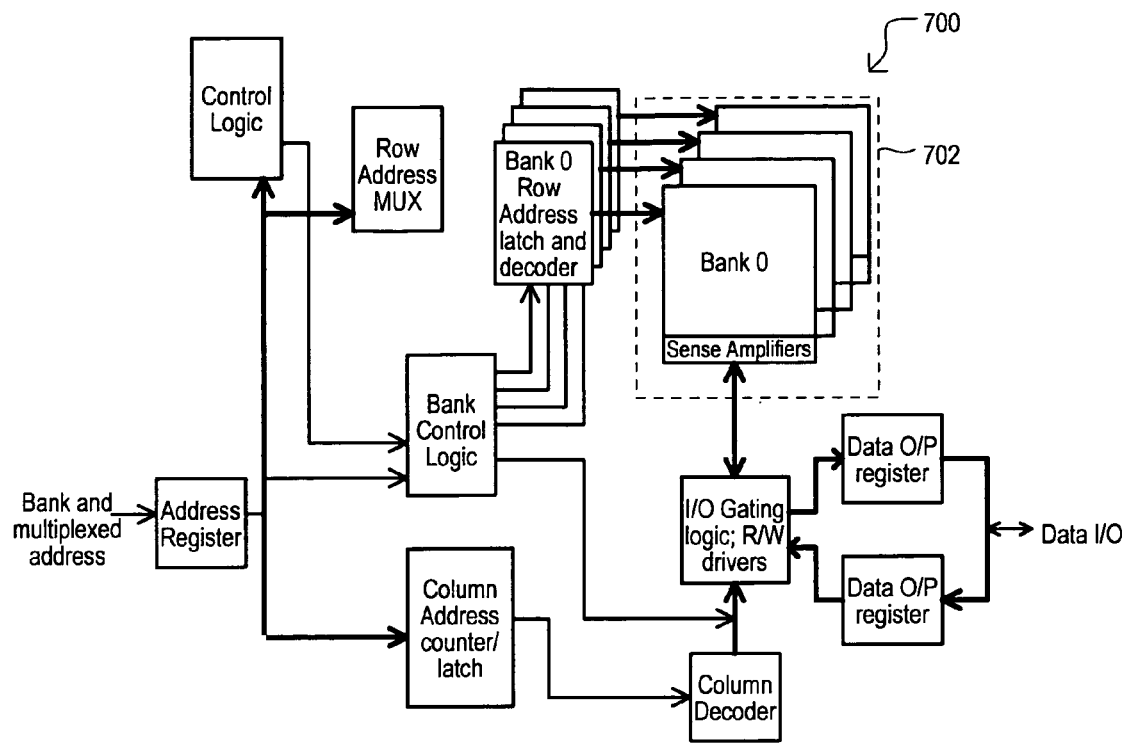
FIG. 7 is a block schematic diagram of a conventional dynamic random access memory (DRAM).
Figure 8:
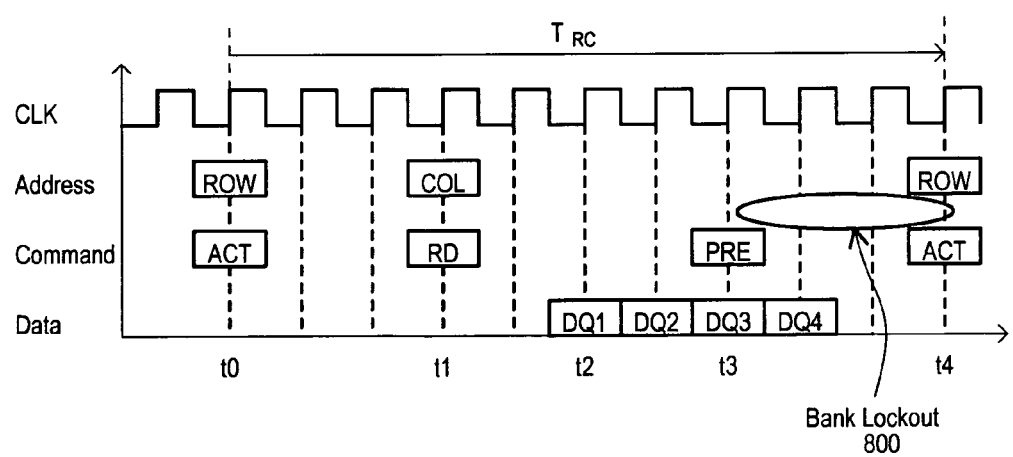
FIG. 8 is a timing diagram showing a conventional timing arrangement.

It is understood that a bank available counter can take a variety of forms. As but one example, FIG. 6 shows a possible example of bank available counter. Referring to FIG. 6, a bank available counter 600 can include a counter 602, a comparator 604, and limit logic 606. A counter 602 can generate a count value that increments according to a clock signal CLK. Counter 602 can start (and reset to "0") according to an activation input ACx. A counter 602 can stop counting according to a bank available indication BAx.

A comparator 604 can output a bank available indication BAx based on a comparison between a count value CNT generated by counter 602 and a limit value LIMIT generated by limit logic 606. In particular, provided a count value is below a certain limit, comparator 604 can output a first value designating bank available indication as inactive. However, once a count value reaches a predetermined limit, comparator 604 can output a second value designating bank available indication as active.

Limit logic 606 can generate a limit value based on a number of input values. In the particular example shown, limit logic can generate a value LIMIT based on an operation type value CMD (e.g., read or write), a CAS latency value CAS_LAT, and a burst length value BURST. Of course, depending upon differences in architecture and configurability, a limit value can be generated based on other values.

Embodiments of the present invention may be well suited to performing various other steps or variations of the steps recited herein, and in a sequence other than that depicted and/or described herein.

For purposes of clarity, many of the details of the improved method and architecture and the methods of designing and manufacturing the same that are widely known and are not relevant to the present invention have been omitted from the following description.

It is also understood that other embodiments of this invention may be practiced in the absence of an element/step not specifically disclosed herein.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A synchronous memory device that accesses data locations in synchronism with a clock signal and has a minimum time period (TRC) between activation of rows within a same bank, comprising:
   an address register coupled to receive at least bank and row addresses;
   a control logic circuit coupled to an output of the address register comprising a bank available counter corresponding to each bank of the memory device, each bank available counter activating a counter output signal no less than period TRC after a row within the corresponding bank is activated, the counter output signal indicating that the corresponding bank is available for access; and
   a row address multiplexer, coupled to provide row address to each of a plurality of banks, each bank containing a plurality of memory cell rows.

2. The memory device of claim 1, further including:
   the memory device comprises a dynamic random access memory; and
   the address register is coupled to receive multiplexed column and row addresses; and
   the control logic circuit is coupled to a receive a column address strobe (CAS) signal and a row address strobe (RAS) signal for designating a type of command executed by the memory device.

3. The memory device of claim 1, further including:
   a plurality of row address decoders, each row address decoder corresponding to a different bank and coupled to the row address multiplexer and activating a row within the corresponding bank in response to at least row address values and bank control signals; and
   a bank control logic circuit coupled to receive control signals from the control logic circuit and address values from the address register that outputs bank control signals to the row address decoders.

4. The memory device of claim 1, further including:
   a column address latch circuit coupled to receive a column address from the address register that generates column decode signals; and
   a column decoder coupled to each bank that selects predetermined columns of the banks in response to at least the column decoder signals.

5. The memory device of claim 1, wherein:
   the memory device comprises an integrated circuit situated within an integrated circuit package having a plurality of conductive pins including a bank available output pin corresponding to each bank; and
   each counter output signal is coupled to the bank available output pin of the corresponding bank.

6. The memory device of claim 1, further including:
   a communication interface (I/F) circuit coupled to receive the counter output signals, and provide bank available data representing the states of the counter output signals based on predetermined input signal values to the communication I/F circuit.

7. The memory device of claim 6, wherein:
   the communication I/F circuit is bidirectional, providing the I/F output data in response to signals received from the memory device and from signals received from another device external to the memory device.

8. The memory device of claim 6, wherein:
   the communication I/F circuit is unidirectional providing the I/F output data to another device external to the memory device in response to signals received from the other device.

9. The memory device of claim 6, wherein:
the communication I/F circuit is unidirectional providing the I/F output data to another device external to the memory device in response to signals generated within the memory device.

10. The memory device of claim 1, further including:
an availability register that stores the output signal values for reading by another device external to the memory device.

11. A memory device, comprising:
a plurality of banks, each bank including a plurality of memory cells arranged into rows and columns, each column being coupled to at least one bit line, bit lines of each bank being precharged between a row access of the bank and a subsequent row access of the same bank;
a counter corresponding to each bank, each counter starting a count in response to a row access of the corresponding bank, and activating an available indication for the bank a predetermined number of clock cycles after a precharge operation following the row access; and
an output circuit for providing available indication information for all banks to a device external to the memory device.

12. The memory device of claim 11, wherein:
the memory device includes
a minimum active-to-access time period between application of a row activation command, and access type command for the row, and
the counter starts counting within the minimum active-to-access time period for the corresponding bank.

13. The memory device of claim 11, wherein:
the memory device includes
a minimum access-to-last data time period between application of an access type command and a time at which bit lines can be precharged, and
the counter counts within the minimum active-to-access time period for the corresponding bank.

14. The memory device of claim 11, wherein:
each counter starts counting at the application of an active command that activates a row of the corresponding bank.

15. The memory device of claim 11, wherein:
each counter starts counting a predetermined number of cycles following the application of an active command that activates a row of the corresponding bank.

16. The memory device of claim 11, further including:
an interface circuit, coupled to receive the available indications, that outputs data corresponding to the available indications in response to signals received from another device.

17. A method of generating bank indication signals in a memory device, comprising the steps of:
receiving a row activation command that activates a row in a corresponding one of a plurality of banks;
in response to a bank activation command, starting a counting operation for the corresponding bank; and
activating a bank available signal for the corresponding bank once the counting operation reaches a predetermined count limit, the bank available signal indicating a row can be accessed in the bank.

18. The method of claim 17, further including:
after receiving the row activation command, receiving a precharge command for the corresponding bank that precharges bit lines of the bank; and
activating the bank available signal includes activating the bank available signal a predetermined delay after the precharge command is received.

19. The method of claim 17, further including:
outputting each bank available signal on a corresponding signal pin of the memory device.

20. The method of claim 17, further including:
accessing data corresponding to the bank available signals via an interface circuit coupled to a memory controller.

* * * * *

UNITED STATES PATENT AND TRADEMARK OFFICE
CERTIFICATE OF CORRECTION

PATENT NO. : 7,394,716 B1
APPLICATION NO. : 11/395416
DATED : July 1, 2008
INVENTOR(S) : Anuj Chakrapani and Rajesh Manapat It is certified that error appears in the above-identified patent and that said Letters Patent is hereby corrected as shown below:

IN THE SPECIFICATION
Please replace the paragraph on column 3, lines 4-16:

"Referring now to FIG. 1, a memory device according to first embodiment is shown in a block diagram and designated by the general reference character 100. A memory device 100 can include a number of banks $102\text{-}0$ to $102\text{-}2^n$, corresponding counters $104\text{-}0$ to $104\text{-}2^n$, respectively, and a signal output circuit 106. a multiple rows. As but one example, each bank ($102\text{-}0$ to $102\text{-}2^n$) can include one or more arrays of memory cells having memory cells of a same row connected to a common word line (or collection of global and local word lines) and memory cells of a same column being connected to one or more common bit lines (or a collection of global and local bit lines). Preferably, memory cells can be dynamic random access memories (DRAMs)."

with the following paragraphs:

-- Referring now to FIG. 1, a memory device according to first embodiment is shown in a block diagram and designated by the general reference character 100. A memory device 100 can include a number of banks $102\text{-}0$ to $102\text{-}2^n$, corresponding counters $104\text{-}0$ to $104\text{-}2^n$, respectively, and a signal output circuit 106.

Each bank ($102\text{-}0$ to $102\text{-}2^n$) can include a number of memory cells arranged into a multiple rows. As but one example, each bank ($102\text{-}0$ to $102\text{-}2^n$) can include one or more arrays of memory cells having memory cells of a same row connected to a common word line (or collection of global and local word lines) and memory cells of a same column being connected to one or more common bit lines (or a collection of global and local bit lines). Preferably, memory cells can be dynamic random access memories (DRAMs). --

UNITED STATES PATENT AND TRADEMARK OFFICE
CERTIFICATE OF CORRECTION

PATENT NO. : 7,394,716 B1
APPLICATION NO. : 11/395416
DATED : July 1, 2008
INVENTOR(S) : Anuj Chakrapani and Rajesh Manapat It is certified that error appears in the above-identified patent and that said Letters Patent is hereby corrected as shown below:

At column 3, line 21, please replace "ACO" with -- AC0 -- so that the corresponding phrase reads -- (AC0 to AC-$2^n$) --.

Signed and Sealed this

Eighteenth Day of November, 2008

JON W. DUDAS
*Director of the United States Patent and Trademark Office*